(12) United States Patent
Arai

(10) Patent No.: US 7,301,606 B2
(45) Date of Patent: Nov. 27, 2007

(54) SUPPORTING PLATE, STAGE DEVICE, EXPOSURE APPARATUS, AND EXPOSURE METHOD

(75) Inventor: Dai Arai, Tokyo (JP)

(73) Assignee: Nikon Corporation, Tokyo (JP)

( * ) Notice: Subject to any disclaimer, the term of this patent is extended or adjusted under 35 U.S.C. 154(b) by 73 days.

(21) Appl. No.: 10/972,366

(22) Filed: Oct. 26, 2004

(65) Prior Publication Data

US 2005/0094125 A1 May 5, 2005

(30) Foreign Application Priority Data

Oct. 31, 2003 (JP) .............................. 2003-373084
Oct. 25, 2004 (JP) .............................. 2004-309324

(51) Int. Cl.
*G03B 27/58* (2006.01)
*G03B 27/52* (2006.01)
*G03B 27/42* (2006.01)

(52) U.S. Cl. .............................. 355/72; 355/30; 355/53

(58) Field of Classification Search .................. 355/30, 355/53, 72, 77; 430/30, 311; 108/24; 52/11, 52/12, 13, 14, 15, 16; 396/611
See application file for complete search history.

(56) References Cited

U.S. PATENT DOCUMENTS

| | | | | |
|---|---|---|---|---|
| 3,381,879 A | * | 5/1968 | Belcher et al. ............. | 229/166 |
| 4,112,632 A | * | 9/1978 | Simpson ........................ | 52/11 |
| 4,168,117 A | * | 9/1979 | Work .......................... | 396/630 |
| 5,121,710 A | * | 6/1992 | Gonzalez ..................... | 119/498 |
| 5,194,350 A | * | 3/1993 | Matsuoka ..................... | 430/30 |
| 5,528,118 A | | 6/1996 | Lee | |
| 5,610,683 A | * | 3/1997 | Takahashi ..................... | 355/53 |
| 5,623,853 A | | 4/1997 | Novak et al. | |
| 5,689,749 A | * | 11/1997 | Tanaka et al. .............. | 396/611 |
| 5,874,820 A | | 2/1999 | Lee | |
| 6,106,712 A | | 8/2000 | New | |
| 6,332,723 B1 | * | 12/2001 | Matsuyama et al. ........ | 396/571 |
| 6,364,547 B1 | * | 4/2002 | Matsuyama et al. ........ | 396/611 |
| 6,509,957 B1 | | 1/2003 | Tanaka | |
| 6,688,045 B1 | * | 2/2004 | Pilcher .......................... | 52/12 |
| 6,809,794 B1 | * | 10/2004 | Sewell ......................... | 355/30 |
| 7,130,037 B1 | * | 10/2006 | Lange ..................... | 356/237.2 |
| 2002/0066140 A1 | | 6/2002 | Gerloff | |
| 2003/0104170 A1 | | 6/2003 | Johnston et al. | |

(Continued)

FOREIGN PATENT DOCUMENTS

EP      1 571 695 A1      9/2005

(Continued)

OTHER PUBLICATIONS

English Translation of Japanese Patent document 6-124873 cited above.*

*Primary Examiner*—Alan Mathews
(74) *Attorney, Agent, or Firm*—Oliff & Berridge, PLC

(57) ABSTRACT

For example, to control an effect due to entrance and leakage of liquid for exposure and allow a preferable exposure processing, a support surface is provided which supports an object. The support surface is liquid repellant, and a collection device is provided which collects liquid from the support surface.

25 Claims, 9 Drawing Sheets

U.S. PATENT DOCUMENTS

| | | |
|---|---|---|
| 2003/0177703 A1 | 9/2003 | Forbis, Sr. et al. |
| 2004/0160582 A1 | 8/2004 | Lof et al. |
| 2005/0219488 A1 | 10/2005 | Nei et al. |
| 2006/0023181 A1 | 2/2006 | Novak |
| 2006/0077367 A1 | 4/2006 | Kobayashi et al. |
| 2006/0132737 A1 | 6/2006 | Magome et al. |
| 2006/0139614 A1 | 6/2006 | Owa et al. |

FOREIGN PATENT DOCUMENTS

| | | |
|---|---|---|
| EP | 1 628 329 A1 | 2/2006 |
| JP | 6-124873 * | 6/1994 |
| JP | A-10-303114 | 11/1998 |
| WO | WO-A-99/49504 | 9/1999 |
| WO | WO 2004/053953 A1 | 6/2004 |

* cited by examiner

SUPPORTING PLATE, STAGE DEVICE, EXPOSURE APPARATUS, AND EXPOSURE METHOD

INCORPORATION BY REFERENCE

The disclosure of the following priority application is herein incorporated by reference in its entirety: Japanese Patent Application No. 2003-373084 filed Oct. 31, 2003.

BACKGROUND OF THE INVENTION

1. Field of the Invention

This invention relates to a supporting plate, a stage device, an exposure device, and an exposure method, and particularly to a supporting plate which is advantageously used with respect to a substrate on a stage, a stage device, an exposure apparatus, and an exposure method, at the time of exposure via a projection optical system that utilizes a liquid immersion technique.

2. Description of Related Art

A semiconductor device and a liquid crystal display device are manufactured by a so-called photolithographic method which transfers a pattern formed on a mask onto a photosensitive substrate. An exposure apparatus which is used in this photolithographic method is provided with a mask stage which supports a mask, and a substrate stage which supports a substrate. The exposure apparatus transfers a mask pattern onto a substrate via a projection optical system while successively moving the mask stage and the substrate stage. Recently, higher resolution of the projection optical system corresponding to higher integration of a device pattern is demanded. The resolution of the projection optical system increases as an exposure wavelength which is used becomes shorter and a numerical aperture of the projection optical system becomes larger. Because of this, the exposure wavelength which is used in exposure apparatus has become shortened over the years, and the numerical aperture of projection optical systems has increased. Furthermore, an exposure wavelength of 248 nm of a KrF excimer laser is currently the mainstream, but an exposure wavelength of 139 nm of an ArF excimer laser also has been put into practice. In addition, in the case of performing exposure, a depth of focus (DOF) also becomes important as well as the resolution. The resolution R and the depth of focus δ can be expressed by the following equations.

$$R = k1 \cdot \lambda / NA \quad (1)$$

$$\delta = \pm k2 \cdot \lambda / NA^2 \quad (2)$$

Here, λ is an exposure wavelength, NA is a numerical aperture of the projection optical system, and k1, k2 are process coefficients. According to equations (1) and (2), in order to increase the resolution R, by shortening the exposure wavelength λ and increasing the numerical aperture NA, it is understood that the depth of focus δ becomes narrower.

When the depth of focus δ becomes too narrow, it is difficult to match a substrate surface with an image plane of the projection optical system, and there is a possibility that a focus margin may become insufficient at the time of an exposure operation. Therefore, a liquid immersion method has been proposed, as disclosed in, e.g., WO99/49504, as a method which substantially shortens an exposure wavelength and broadens the depth of focus. This liquid immersion method forms a liquid immersion area by filling the space between a lower surface of the projection optical system and a substrate surface with liquid such as water, an organic solvent, or the like, and improves the resolution by taking advantage of the fact that the wavelength of the exposure light in liquid becomes 1/n (n is normally approximately 1.2 through 1.6 depending on the index of refraction of the liquid) as compared to the wavelength in air, and increases the depth of focus by approximately n-times.

SUMMARY OF THE INVENTION

The following problems exist in the above-mentioned apparatus that utilizes liquid immersion.

In the above-mentioned exposure apparatus, exposure is performed in a state in which liquid is filled between a projection optical system and a wafer, so there are cases in which liquid may be splashed to locations external of the wafer if an unexpected operation is performed due to errors when a stage moves.

For example, in the exposure apparatus described in WO99/49504, liquid is supplied between a projection optical system and a wafer by a liquid supply mechanism, and the supplied liquid is collected from the space between the wafer and the projection optical system by a liquid collection mechanism using vacuum suction or the like. However, once the operation of the liquid collection mechanism stops in a state in which the liquid supply mechanism is still operated, there is a possibility that the liquid on the wafer may increase and be splashed at the periphery.

Because of this, in a liquid immersion exposure apparatus, there is a possibility that problems may occur such as device/member failure, leaking, rust/oxidation, etc. due to splashed liquid. Furthermore, in this case, there also is a problem that exposure processing cannot be performed well.

It is a first object of this invention to provide a supporting plate which suppresses an effect due to leakage and entrance of exposure liquid, and which enables a good exposure processing, and to a stage device, an exposure apparatus, and an exposure method using that supporting plate.

In order to accomplish the above-mentioned object, the following structure can be used. A supporting plate according to one embodiment of this invention includes a support surface which supports an object, and the supporting plate is made to be liquid repellent. In addition, a collection device is arranged to collect liquid from the supporting plate.

In the supporting plate of this embodiment of the invention, even when the liquid is splashed or discharged to the supporting plate, this liquid can be collected by the collection device. Therefore, it is possible to suppress problems such as device/member failure, leaking, rust/oxidation, etc., or to reduce the effects of such problems. In addition, with this embodiment of the invention, the supporting plate is liquid repellent, so the splashed or discharged liquid cannot be spread over the support surface, and can easily move off the plate. Thus, a collection operation can be performed easily.

A stage device according to one embodiment of this invention is provided with a movable body which holds a substrate, and in which liquid is supplied to a surface of the substrate, and a supporting plate which movably supports the movable body. When liquid is discharged to the supporting plate, a collection device is arranged which collects the discharged liquid.

Therefore, in the stage device of this embodiment of the invention, even when liquid is splashed or discharged to the supporting plate from the surface of the substrate when the movable body moves or the like, the liquid can be collected by the collection device, so it is possible to suppress problems such as a device/member failure, leakage, rust/oxidation, etc., or to reduce the effects of such problems.

An exposure apparatus according to one embodiment of this invention exposes a pattern of a mask onto a photosensitive substrate which is held to a substrate stage via a projection optical system. The stage device described above is used as a substrate stage, and a pattern image is projected onto the photosensitive substrate via liquid which is filled between an end portion of the projection optical system and the photosensitive substrate.

An exposure method of one embodiment of this invention, in which a pattern of a mask is exposed to a substrate on a substrate stage, which is movably supported on a supporting plate, by a projection optical system includes a step of filling between an end portion of a projection optical system and the substrate with liquid, and a step of collecting the discharged liquid when the liquid is discharged to the supporting plate.

Thus, according to exposure apparatus and exposure methods of some embodiments of this invention, even when the liquid which is filled between the end portion of the projection optical system and the photosensitive substrate is splashed/discharged to the supporting plate, this liquid can be collected by the collection device. Thus, it is possible to suppress problems such as a device/member failure, leakage, rust/oxidation, etc., or to at least reduce the effects of such problems.

BRIEF DESCRIPTION OF THE DRAWINGS

The invention will be described in conjunction with the following drawings in which like reference numerals designate like elements, and in which.

DETAILED DESCRIPTION OF PREFERRED EMBODIMENTS

The following explains some examples of a supporting plate, a stage device, an exposure apparatus, and an exposure method which utilize aspects of this invention.

Figure 1:
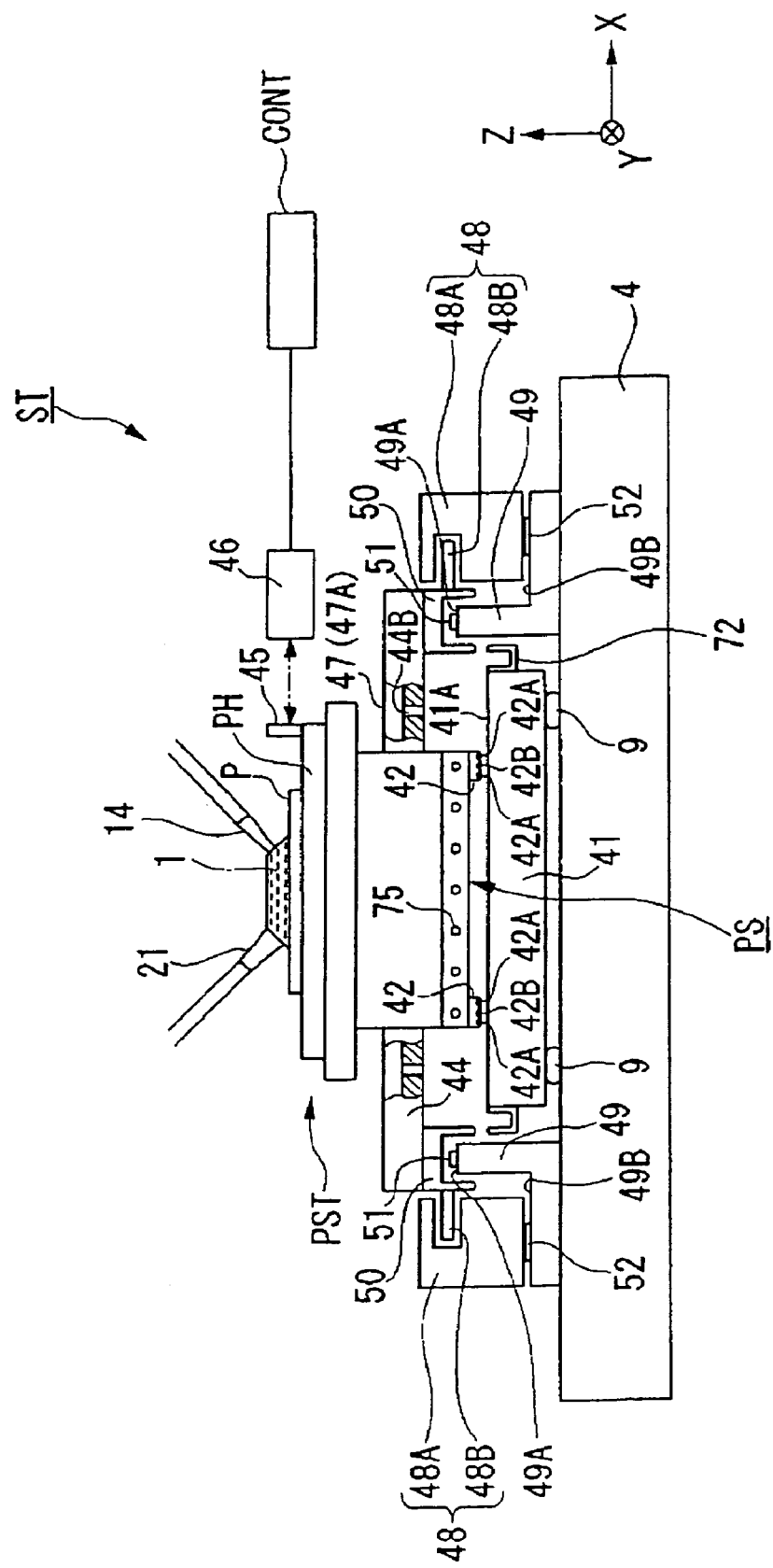
FIG. 1 is a schematic structure diagram showing a supporting plate and a stage device of a first embodiment of this invention.

A first embodiment explains a supporting plate according to some aspects of this invention, and a stage device provided with this supporting plate. FIG. 1 is a schematic structural diagram showing an embodiment of a stage device utilizing some aspects of this invention.

A stage device ST shown in FIG. 1 is mainly constituted by a substrate supporting plate (supporting plate) 41 which is supported by three or four points on a base plate 4 via a vibration isolation unit (removal device) 9, a substrate stage PST as an object (movable body) which supports the substrate P and moves a top surface (support surface) 41A of the substrate supporting plate 41, an X linear motor 47 which drives the substrate stage PST in an X axis direction (horizontal direction in FIG. 1), and a Y linear motor 48 which drives the substrate stage PST in a Y axis direction (direction perpendicular to a paper plane of FIG. 1). The vibration isolation unit 9 is provided with an actuator such as an air mount, a voice coil motor, or the like in which an internal pressure can be controlled, and is constituted such that the substrate supporting plate 41 is driven in a direction perpendicular to the top surface 41A by driving the actuator.

The substrate stage PST is constituted by a table portion PH which adsorbs (by suction) and holds the substrate P, and a stage portion PS which is movably arranged along with table portion PH. In addition, air bearings 42, which are formed of a plurality of non-contact bearings, are arranged under the stage portion PS. The air bearings 42 are provided with exit ports 42B which discharge air to the top surface (guide surface) 41A of the substrate supporting plate 41, and intake ports 42A which adsorb air between the lower surface (bearing surface) of the substrate stage PST and the guide surface 41A. Due to the balance between the pressing force of the outflow of air from the exit ports 42B and an adsorption force by the intake ports 42A, a predetermined space is maintained between the lower surface of the substrate stage PST (stage portion PS) and the guide surface 41A. That is, the substrate stage PST is supported in a non-contact manner by the air bearings 42 with respect to the top surface (guide surface) 41A of the substrate supporting plate 41, and is two-dimensionally movable within a plane parallel to the top surface 41A, i.e., within an XY plane, and is micro-rotatable in a θZ direction of rotation about an axis parallel to a Z axis, which is perpendicular to the top surface 41A. Furthermore, the table portion PH is movably arranged in the Z axis direction, θX direction (direction of rotation about an axis parallel to the X axis), and θY direction (direction of rotation about an axis parallel to the Y axis). The substrate stage drive mechanism is controlled by a control device CONT. That is, the table portion PH controls a Z position and an inclination angle of the substrate P, matches the surface of the substrate P with a predetermined plane position, and positions the substrate P in the X axis direction and Y axis direction.

Furthermore, spray ports (second removal devices) 75 which spray air are arranged in the vicinity of the bottom portion of the stage portion PS. The spray ports 75 spray air, which removes any liquid remaining on the top surface 41A of the substrate supporting plate 41, in a diagonally downward direction toward the top surface 41A. A plurality of spray ports are formed in the four corners of the periphery of the stage portion PS (see FIG. 2; however, in FIG. 2, spray ports that are formed on the +X side and +Y side of the stage portion PS are not depicted), and are connected to an undepicted air supply source.

Moving mirrors 45 are arranged on the substrate stage PST (i.e., on a surface 62 of the table portion PH). Furthermore, laser interferometers 46 are arranged at positions opposite to the moving mirrors 45. The position of the substrate P on the substrate stage PST in the two-dimensional directions X and Y, and the rotation angle are measured by the laser interferometers 46 in real time, and the measurement results are provided to the control device CONT. The control device CONT positions the substrate P, which is supported on the substrate stage PST, by driving a substrate stage drive mechanism including a linear motor based on the measurement result of the laser interferometers 46. Additionally, the moving mirrors 45 can be arranged on the side surfaces of the substrate stage PST, and the table portion PH can be made to be entirely flat.

Also arranged on the substrate stage PST (table portion PH) in the vicinity of the substrate P are a supply nozzle 14 which supplies liquid 1 to the substrate P, and a collection nozzle 21 which collects the liquid 1 on the substrate P.

Figure 2:
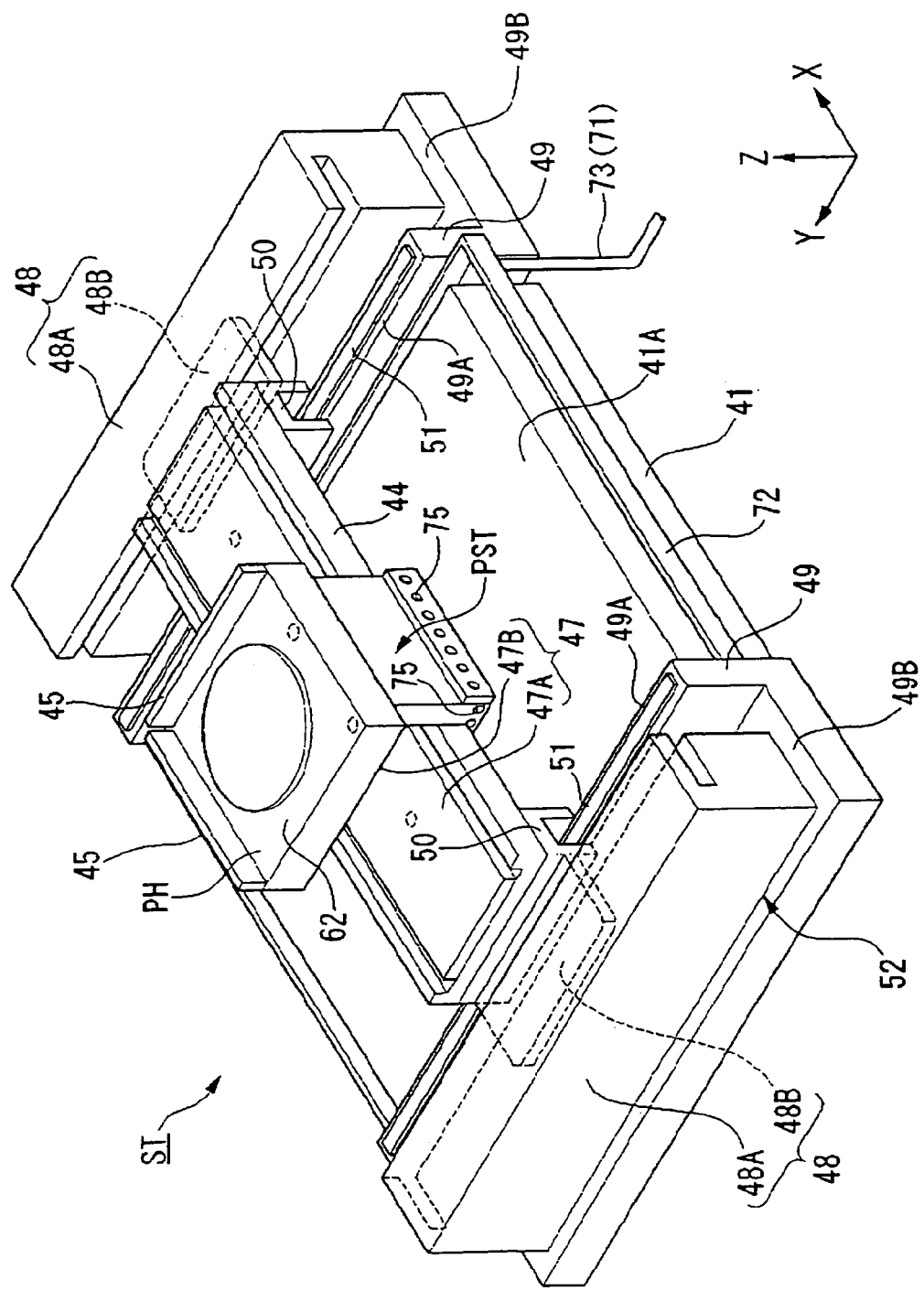
FIG. 2 is a perspective view showing a stage device.

FIG. 2 is a schematic perspective view showing the substrate stage PST and the substrate stage drive mechanism which drives the substrate stage PST. In FIG. 2, the substrate stage PST (stage portion PS) is movably supported by an X guide stage 44 in the X axis direction. The substrate stage PST can be moved by an X linear motor 47 in the X axis direction by a predetermined stroke, while being guided with the X guide stage 44. The X linear motor 47 is provided with a stator 47A which is arranged so as to extend on the X guide stage 44 in the X axis direction, and a movable portion 47B which is fixed to the substrate stage PST and arranged in correspondence with the stator 47A. Furthermore, the movable portion 47B is driven with respect to the stator 47A, so the substrate stage PST is moved in the X axis direction. Here, the substrate stage PST is supported in a non-contact manner by a magnetic guide formed of a magnet and an actuator, which maintains a predetermined gap in the Z axis direction with respect to the X guide stage 44. The substrate stage PST is moved by the X linear motor 47 in the X axis direction in a state in which the substrate stage PST is supported in a non-contact manner on the X guide stage 44. Furthermore, this is not depicted, but by arranging an encoder scale on the X guide stage 44 and measuring the encoder scale in the substrate stage PST, an encoder (encoder head) is provided which measures the relative positional relationship between the X guide stage 44 and the substrate stage PST.

Figure 3:
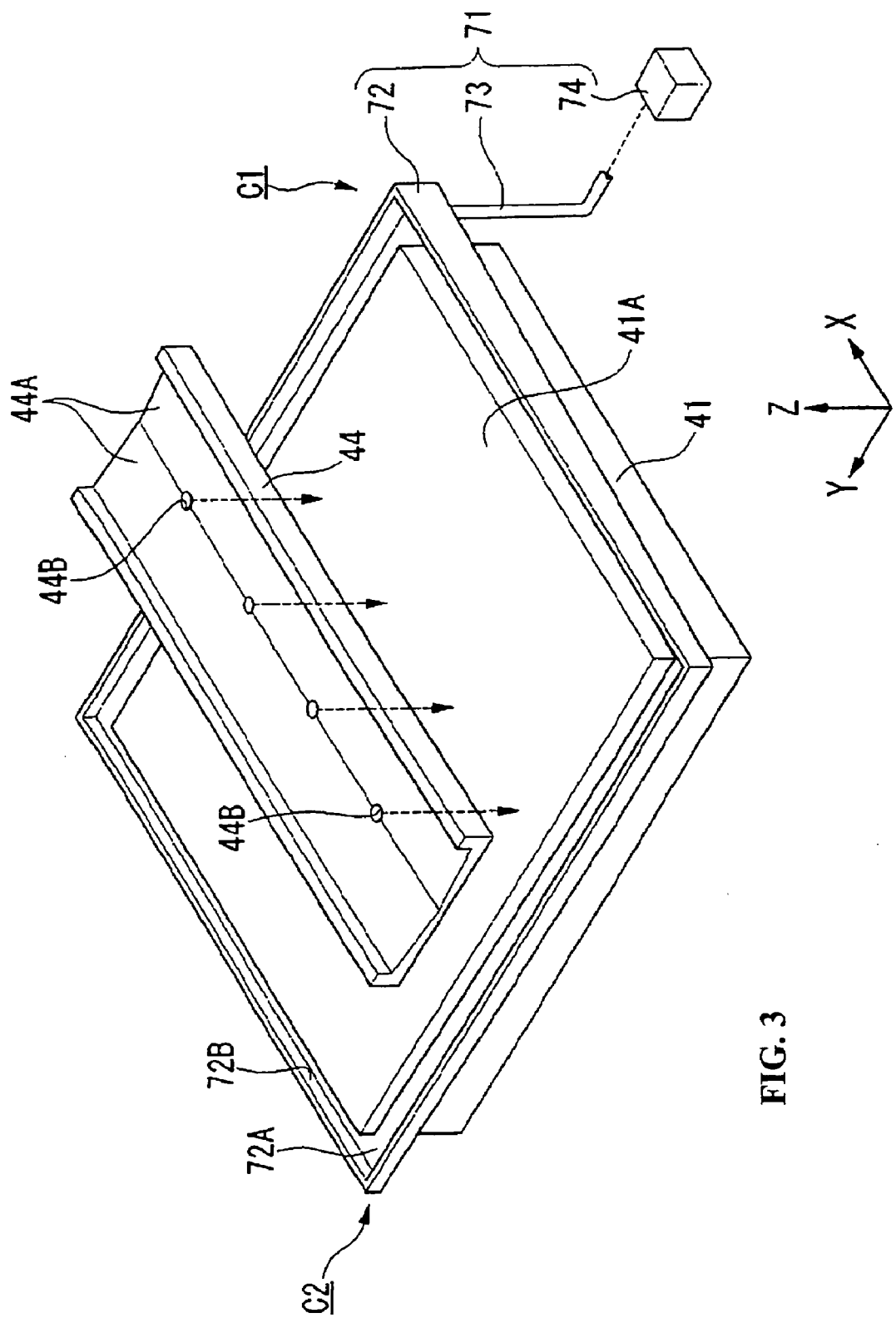
FIG. 3 is an outer perspective view showing an X guide stage and a substrate supporting plate within the stage device.

FIG. 3 is a diagram showing only the X guide stage 44 and the substrate supporting plate 41 of the stage device ST shown in FIG. 2.

As shown in FIG. 3, the X guide stage 44 which is a stage structural body and arranged above the substrate supporting plate 41 is formed in a cross-sectional substantially concave shape which is opened upwardly. On the top surface, inclined surfaces (second inclined portion) 44A are formed which are inclined gradually downward to the substantially central portion in the width direction. In addition, at the low end portion (the lowest portion) of the inclined surfaces 44A, a plurality of drain ports (through holes) 44B are formed, spaced apart from each other in a longitudinal direction of the X guide stage 44. The drain ports 44B are formed so as to be positioned above the top surfaces 41A of the substrate supporting plate 41, i.e., at positions such that when liquid is discharged from the drain ports 44B, the liquid drips onto the top surfaces 41A.

In addition, the stator 47A of the X linear motor 47 and the inclined surfaces 44A (i.e., the concave portion of the X guide stage 44) are spaced apart from each other by using an undepicted spacer located within a concave portion of the X guide stage 44, so as to not prevent liquid from moving along the inclined surfaces 44A.

Additionally, the stage device ST includes a collection device 71 that collects liquid discharged to the substrate supporting plate 41. The collection device 71 is constituted by a gutter (collection portion) 72 which is arranged along the outer circumference of the substrate supporting plate 41, a waste liquid tube 73 which is connected to the gutter 72, and a suction device 74 which suctions the liquid discharged to the gutter 72 via the waste liquid tube 73.

The gutter 72 is formed in a cross-sectional substantially U shape (concave shape), which is opened upwardly (see FIG. 1), and liquid repellent coating (liquid repellent processing) of a fluorine or fluorine compound is performed on the bottom surface 72A and the side surface 72B within the concave portion. In addition, the bottom surface 72A of the gutter 72 is arranged at a position lower than the top surface 41A of the supporting plate 41. A corner portion C1 (corner of the +X and −Y sides) connected to the waste liquid tube 73 is made to be the lowest portion, and a corner portion C2 opposite to the corner portion C1 is made to be the highest position. This forms inclined portions, which are inclined in both the X axis direction and the Y axis direction.

Additionally, on the top surface 41A of the substrate supporting plate 41 as well, in the same manner as the gutter 72, liquid repellent coating formed of fluorine or fluorine compound is performed, and thus liquid repellency is provided.

Furthermore, liquid repellent coating for the substrate supporting plate 41 can be performed for the entire substrate supporting plate 41, not only for the top surface 41A.

Meanwhile, on both ends in the longitudinal direction of the X guide stage 44, a pair of Y linear motors 48, 48 are arranged which can move the X guide stage 44 with the substrate stage PST in the Y axis direction. The respective Y linear motors 48, 48 are provided with movable parts 48B which are arranged on both ends, in the longitudinal direction, of the X guide stage 44, and stators 48A which are arranged in correspondence with the movable parts 48B. Furthermore, as the movable parts 48B are driven by the stators 48A, the X guide stage 44 is moved in the Y axis direction along with the substrate stage PST. Furthermore, by adjusting the respective drives of the Y linear motors 48, 48, the X guide stage 44 can be rotatably moved in the θZ direction. Therefore, the substrate stage PST can be moved by the Y linear motors 48, 48 in the Y axis direction and in the θZ direction substantially integrally with the X guide stage 44.

On both sides of the X axis direction of the substrate supporting plate 41, guide portions 49 are arranged which are formed in an L shape as seen from a front view and guide the movement of the X guide stage 44 in the Y axis direction. In this embodiment, stators 48A of the Y linear motors 48 are arranged on the flat portions 49B of the guide portions 49. Meanwhile, U-shaped guide members 50 are respectively arranged on both end portions in the longitudinal direction under the X guide stage 44. The guide portions 49 are engaged to the guide members 50 and arranged so that the top surfaces (guide surfaces) 49A of the guide portions 49 face the internal surfaces of the guide members 50. Air bearings 51 which are non-contact bearings are arranged on the guide surfaces 49A of the guide portions 49, and the X guide stage 44 is supported in a non-contact manner with respect to the guide surfaces 49A.

Additionally, air bearings 52 which are non-contact bearings exist respectively between the stators 48A of the Y linear motors 48 and the flat portions 49B of the guide portions 49, and the stators 48A are supported in a non-contact manner with respect to the flat portions 49B of the guide portions 49 by the air bearings 52. Because of this, due to the conservation of momentum, according to the movement in the +Y direction (or −Y direction) of the X guide stage 44 and the substrate stage PST, the stators 48A are moved in the −Y direction (or +Y direction). Due to the movement of the stators 48A, a reaction force caused due to the movement of the X guide stage 44 and the substrate stage PST is canceled, and changes in a centroid position can be avoided. That is, the stators 48A function as a so-called countermass.

In the above-mentioned structured stage device ST, by controlling a supply amount of the liquid 1 from the supply nozzle 14 and a collection amount of the liquid 1 by the collection nozzle 21, in a condition in which a predetermined amount of liquid 1 is maintained on the surface of the substrate P, the substrate stage PST can be moved by the substrate stage drive mechanism along the supporting plate 41.

Here, due to reasons such as the occurrence of a problem in liquid collection by the collection nozzle 21, etc., when liquid is splashed or discharged from the substrate, part of the liquid drips (or spills) onto the X guide stage 44, and another part drips (or spills) onto the top surface 41A of the substrate supporting plate 41.

The liquid discharged to the X guide stage 44 flows along the inclined surfaces 44A without remaining within the concave portion, and drips onto the top surface 41A of the substrate supporting plate 41 via the drain ports 44B at the lower end portion of the inclined surfaces 44A (see FIG. 3).

Here, when the substrate stage PST is operated, air is sprayed out from the spray ports 75, arranged in the bottom portion of the substrate stage PST (stage portion PS), to the top surface 41A. The top surface 41A of the supporting plate 41 is provided with liquid repellency. Thus, the liquid discharged to the top surface 41A is moved as liquid drops and is collected by the gutter 72. Furthermore, in the gutter 72 as well, liquid repellent processing is performed, and the bottom surface 72A is inclined, so liquid is discharged (rolls) below the top surface 41A (i.e., below the surface of the substrate P) along the bottom surface 72A in a liquid drop state, and is discharged and collected from the waste liquid tube 73 through suction by the suction device 74.

Meanwhile, when the operation of the substrate stage PST is stopped, for example, due to an error, there is a possibility that liquid which is at a position in which air is not supplied from the spray ports 75 may remain on the substrate supporting plate 41. In this case, by driving actuators (e.g., linear motors, voice coil motors, etc.) of the vibration isolation units 9, the top surface 41A of the substrate supporting plate 41 is inclined with respect to a horizontal plane. By doing this, liquid drops roll over the top surface 41A and fall into the gutter 72. At this time, regardless of the direction of inclination of the substrate supporting plate 41, the bottom surface 72A of the gutter 72 is inclined. Thus, the liquid can be collected via the waste liquid tube 73, but by making the supporting plate 41 inclined at a position in which the corner portion C1 connected to the waste liquid tube 73 is the lowest, the liquid drops are discharged to the gutter 72 in the vicinity of the corner portion C1, so the time until the liquid on the supporting plate 41 is discharged via the waste liquid tube 73 can be shortened, which is preferable.

Thus, in this embodiment, even when the liquid supplied onto the substrate P is splashed and discharged to the substrate supporting plate 41 for some reason, this liquid can be collected by the collection device 71, so problems due to the splashed and discharged liquid, such as device/member failure, leaking, rust/oxidation, etc., can be avoided. Additionally, in this embodiment, the bottom portion 72A of the gutter 72 of the collection device 71 has liquid repellency, and an inclined surface is provided which discharges the liquid below the supporting plate top surface 41A, so discharging and collection can be smoothly performed without clogging the liquid in the gutter 72. In addition, in this embodiment, liquid repellency is provided on the top surface 41A of the substrate supporting plate 41, so the liquid cannot be easily attached to the surface, but rather can be easily dripped into the gutter 72. Additionally, in this embodiment, air is sprayed from the spray ports 75 to the supporting plate top surface 41A, so the liquid which remains on the surface can be easily removed, and even when the liquid is splashed onto the supporting plate top surface 41A during the drive of the substrate stage PST, the possibility of liquid being caught between the air bearings 42 and the top surface 41A can be reduced, and this can contribute to the stable drive of the substrate stage PST. Furthermore, in this embodiment, even when the liquid cannot be removed with air spray, the liquid can be easily removed by inclining the substrate supporting plate 41 by the vibration isolation units 9.

Furthermore, in the embodiment which was thus described, the liquid which has been discharged can be collected by the substrate supporting plate 41, so a structure is provided in which the liquid supplied onto the surface of the substrate P does not collect on the substrate stage PST. In this case, vibration due to the liquid collection can be controlled, and by covering a large part of the substrate surface by liquid, the temperature deterioration of the substrate due to air heat can be controlled.

Additionally, in this embodiment, in the X guide stage 44 as well, the splashed/discharged liquid can be guided downwardly by the inclined surfaces 44A and discharged from the drain ports 44B, so a heat effect due to the liquid remaining on the X guide stage 44 can be suppressed, and it is possible to suppress liquid from generating water stains and bacteria, as water tends to do. In addition, in the X guide stage 44 as well, in the same manner as the supporting plate top surface 41A and the bottom surface 72A of the gutter 72, it is preferable that liquid movement can be easily facilitated by applying liquid repellency. Furthermore, it is preferable that an encoder head or the like arranged on the substrate stage PST should be covered by a cover or the like so as to not contact the liquid.

Figure 4:
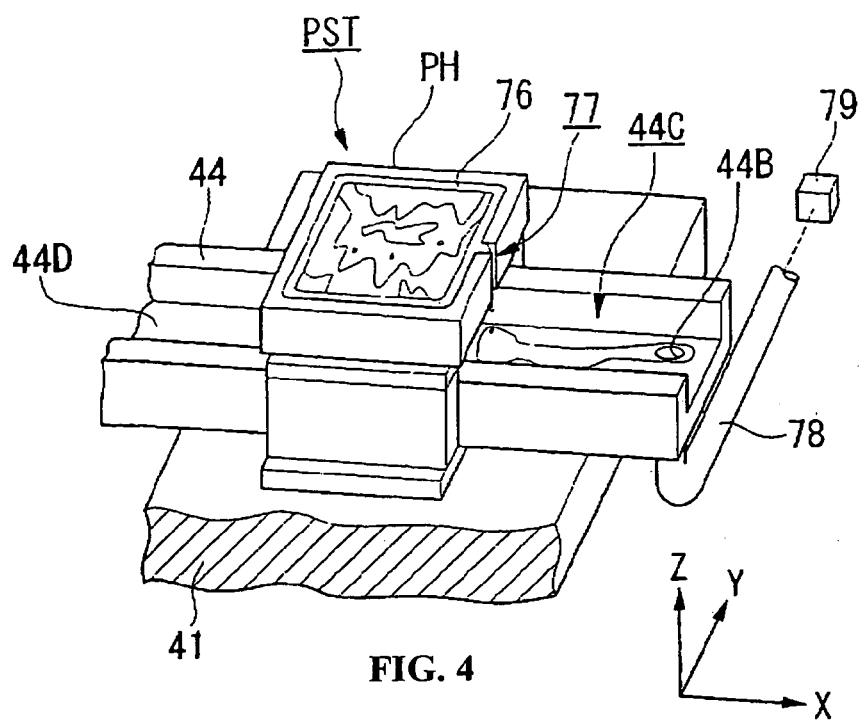
FIG. 4 is a perspective view showing a schematic structure of a supporting plate and a stage device according to a second embodiment of this invention.
Figure 5:
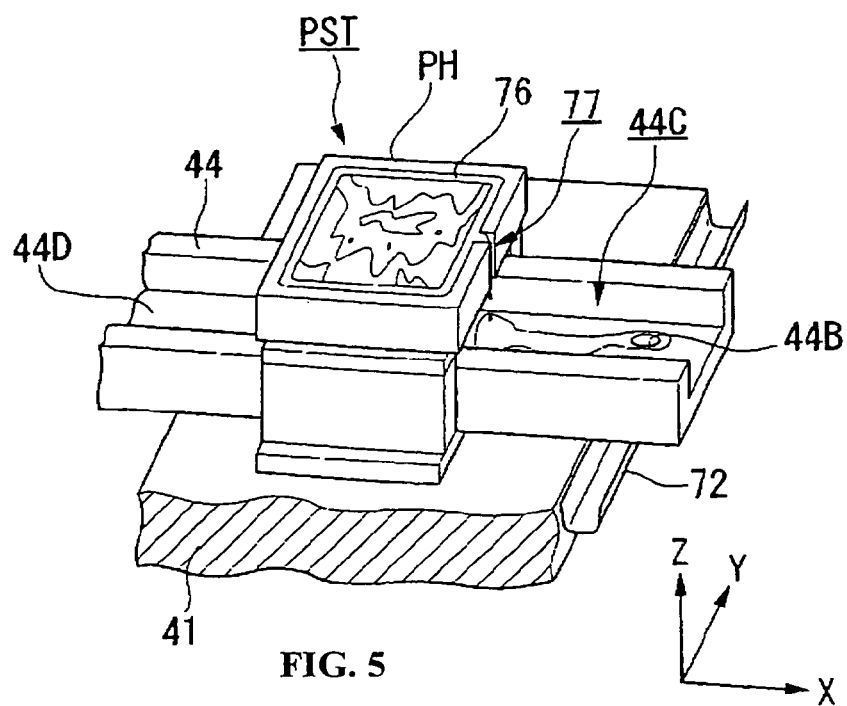
FIG. 5 is a perspective view showing a schematic structure of a supporting plate and a stage device according to a third embodiment of this invention.

Next, a second embodiment of a supporting plate and stage device utilizing aspects of this invention is explained. FIG. 4 is a diagram schematically showing the substrate stage PST, the substrate supporting plate 41, and the X guide stage 44 within the stage device. Furthermore, in FIG. 4, the moving mirror and the substrate on the substrate stage PST, and the gutter of the substrate supporting plate 41 are omitted from the drawing, although they would be present in the actual device.

In this embodiment, as shown in FIG. 4, on the top surface of the table portion PH of the substrate stage PST, a groove portion 76 is formed along an edge (outer circumference). Furthermore, on one side surface of the table portion PH, a slot portion 77 is formed which is positioned above a concave portion 44C of the X guide stage 44, and extends in the Z axis direction, and is connected to the groove portion 76.

Furthermore, in the concave portion 44C of the X guide stage 44, a drain port 44B is formed at a position displaced in an outward direction from the substrate supporting plate 41 in the X direction. A waste liquid tube 78 is connected to the waste drain port 44B. Additionally, a suction device 79 which suctions liquid via the waste liquid tube 78 is connected to the waste liquid tube 78. Furthermore, in the X guide stage 44, the bottom portion 44D within the concave portion 44C is formed so as to be inclined so that the drain port 44B is located at the lowest part.

In the above-mentioned structure, the liquid applied onto the table portion PH is discharged to the groove portion 76 and then to the concave portion 44C of the X guide stage 44 via the slot portion 77. Furthermore, the liquid discharged to the concave portion 44C is discharged to the drain port 44B along the incline of the bottom portion 44D, and is discharged and collected from the waste liquid tube 78 due to the suction of the suction device 79.

Thus, in this embodiment, the liquid splashed and discharged to the concave portion 44C of the X guide stage 44 does not reach the top surface 41A of the substrate supporting plate 41, so it is possible to reduce the liquid amount which remains on the top surface 41A. Additionally, a possibility of liquid being caught between the air bearings and the top surface 41A can be further reduced. Therefore, the drive stability of the substrate stage PST can be further improved.

Next, a third embodiment of a supporting plate and stage device utilizing aspects of this invention is explained. The only difference between the third and second embodiments is the structure which discharges liquid from the drain port 44B. That is, in this embodiment, the drain port 44B of the X guide stage 44 is formed above the gutter 72. Furthermore, a waste liquid tube or the like is not connected to the drain port 44B.

In the above-mentioned structure, the liquid discharged to the concave portion 44C of the X guide stage 44 flows along the incline of the bottom portion 44D, and is collected by the gutter 72 as it naturally drips from the drain port 44B. Thus, in this embodiment, the liquid splashed and discharged to the X guide stage 44 is not forcibly adsorbed, so generation of vibration due to suction can be suppressed.

Next, an exposure apparatus provided with the stage device ST shown in the above-mentioned first embodiment is explained with reference to FIGS. 6-8. In this embodiment, in an exposure apparatus which projects and exposes a pattern image of a mask onto a photosensitive substrate, an example is used in which a stage device of the above-mentioned embodiment is applied to a substrate stage which holds and moves a photosensitive substrate. Additionally, in this embodiment, the same symbols as in the above-mentioned first embodiment are used for the same structural elements, and their explanation is omitted or simplified.

Figure 6:
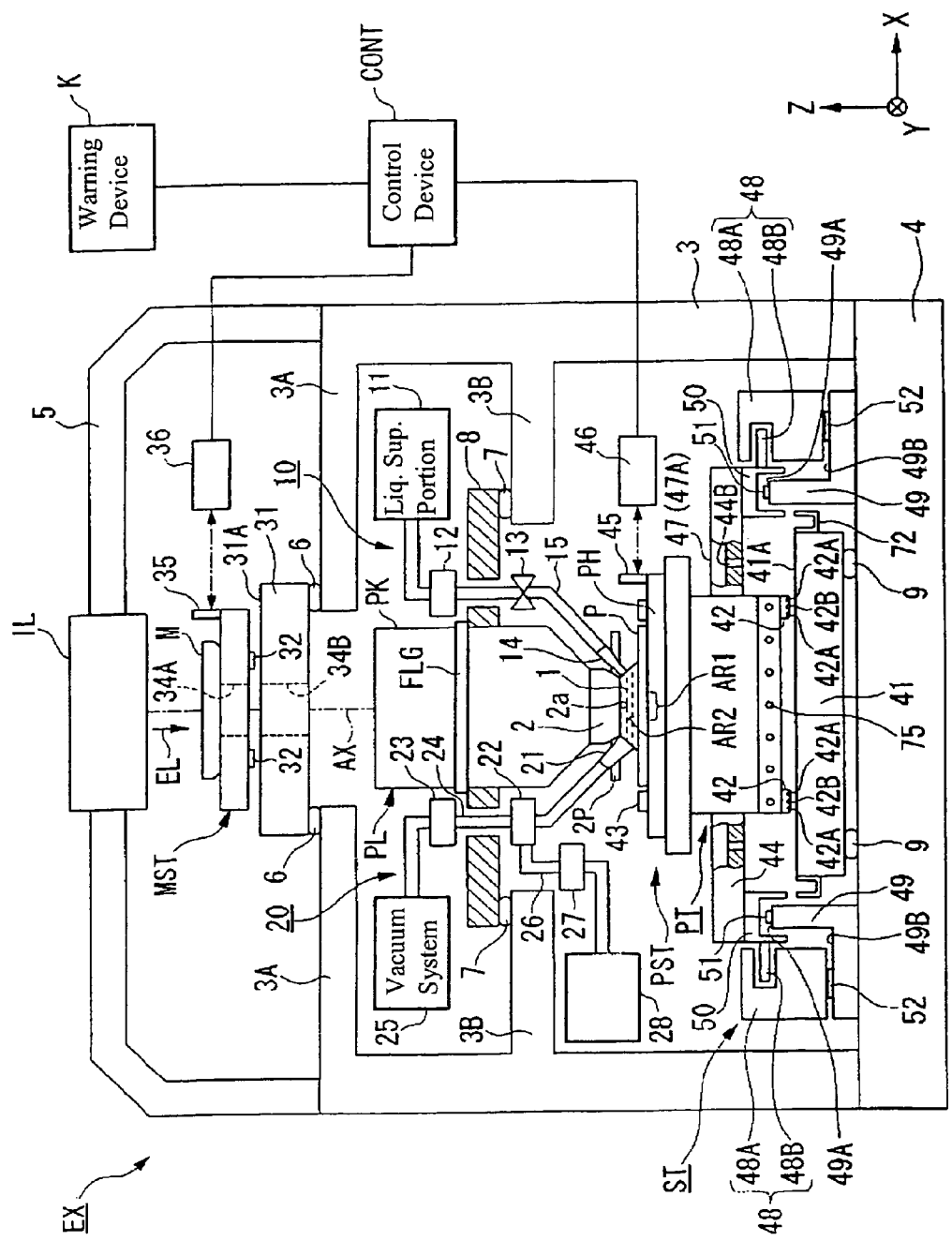
FIG. 6 is a schematic structure diagram showing an exposure device utilizing an embodiment of this invention.

FIG. 6 is a schematic structural diagram showing an exposure apparatus utilizing aspects of this invention.

In FIG. 6, an exposure apparatus EX is equipped with a mask stage MST that supports a mask M, a stage device ST shown in FIGS. 1-3 having a substrate stage PST that supports a substrate (photosensitive substrate) P, an illumination optical system IL that illuminates with exposure light EL the mask M supported by the mask stage MST, a projection optical system PL that projects and exposes a pattern image of the mask illuminated by the exposure light EL onto the substrate P supported by the substrate stage PST, and a control device CONT that generally controls the operation of the entire exposure apparatus EX. To the control device CONT, a warning device K that generates warnings when abnormalities occur in the exposure process is connected. In addition, the exposure apparatus EX is equipped with a main column 3 that supports the mask stage MST and the projection optical system PL. The main column 3 is placed on a base plate 4 mounted horizontally to the floor. An upper side step portion 3A and a lower side step portion 3B that project inwardly are formed on the main column 3.

The exposure apparatus EX of this embodiment is an immersion exposure apparatus, in which an immersion method is used to substantially widen the depth of focus as well as increase the resolution by substantially shortening the exposure wavelength, and which is equipped with a fluid supply mechanism 10 that supplies fluid 1 onto the substrate P and a fluid collecting mechanism 20 that collects the fluid 1 from the substrate P. The exposure apparatus EX forms an immersion region AR2 at a part of the substrate P including a projection region AR1 of the projection optical system PL by the fluid 1 supplied from the fluid supply mechanism 10. In detail, the exposure apparatus EX fills the fluid 1 between an optical element 2 located at a front end portion (lower end portion) of the projection optical system PL and a surface of the substrate P, and exposes the substrate P by projecting a pattern image of the mask M onto the substrate P through the fluid between the projection optical system PL and the substrate P.

In this embodiment, the explanation is made with an example using a scanning-type exposure apparatus (a so-called scanning stepper), as the exposure apparatus EX, that exposes a pattern formed on the mask M onto the substrate P while synchronously moving the mask M and substrate P in mutually different directions (opposite directions) in the scanning direction. In the below description, the direction that matches an optical axis AX of the projection optical system PL is designated as a Z-axis direction, a direction (scan direction) of the synchronous movement by the mask M and the substrate P in a plane perpendicular to the Z-axis direction is designated as an X-axis direction, and the direction (non-scan direction) perpendicular to the Z-axis direction and the X-axis direction is designated as a Y-axis direction.

The term "substrate" includes a substrate on which a photoresist, which is a photosensitive material, is applied on a semiconductor wafer, and the term "mask" includes a reticle on which a device pattern to be reduced and projected on the substrate is formed.

The illumination optical system IL is supported by a support column 5 fixed on the upper part of the main column 3. The illumination optical system IL illuminates the mask M supported by the mask stage MST with the exposure light EL, and has an exposure light source, an optical integrator that uniformizes the intensity of the luminous flux ejected from the exposure light source, a condenser lens that collects the exposure light EL from the optical integrator, a relay lens system, and a variable field stop that sets an illumination region on the mask M by the exposure light EL in a slit shape. The predetermined illumination region on the mask M is illuminated with the exposure light EL having a uniform intensity distribution by the illumination optical system IL. As the exposure light EL ejected from the illumination optical system IL may be a bright line in the ultraviolet region (g-line, h-line, or i-line) ejected from a mercury lamp, ultraviolet light (DUV light), such as KrF excimer laser light (wavelength: 248 nm), and vacuum ultraviolet light (VUV light), such as ArF excimer laser light (wavelength: 193 nm) and $F_2$ laser light (wavelength: 157 nm). In this embodiment, the ArF excimer laser light is used.

In this embodiment, pure water is used as the fluid 1. The pure water is transmissive to the bright line in the ultraviolet region (g-line, h-line, or i-line) ejected from the mercury lamp, for example, and the far ultraviolet light (DUV light), such as the KrF excimer layer light (wavelength: 248 nm).

The mask stage MST supports the mask M and is equipped with an opening 34A for passing the pattern image of the mask M in the center part thereof On the upper side step portion 3A of the main column 3, a mask support plate 31 is supported via a vibration isolation unit 6. An opening 34B for passing the pattern image of the mask M is also formed in the center part of the mask support plate 31. A plurality of air bearings 32, which are non-contact bearings, are provided on the lower surface of the mask stage MST. The mask stage MST is supported on the upper surface (guide surface) 31A of the mask support plate 31 by the air bearing 32 without contact, and is movable two-dimensionally in the plane perpendicular to the optical axis AX of the projection optical system PL, that is, the XY plane, and minutely rotatable in the θZ direction, by the mask stage drive mechanism, such as a linear motor. A movable mirror 35 is provided on the mask stage MST. A laser interferometer 36 is provided at a position facing the movable mirror 35. The position in a two-dimensional direction and a rotational angle in the θZ direction (including rotational angles in the θX and θY directions depending on the case) of the mask M on the mask stage MST are calculated in real time by the laser interferometer 36, and the result of such measurements is output to the control device CONT. The control device CONT controls the position of the mask M supported by the mask stage MST by driving the mask stage drive mechanism based on the result of measurement by the laser interferometer 36.

The projection optical system PL projects and exposes the pattern of the mask M onto the substrate P at a predetermined projection magnification β, and consists of a plurality of optical elements including an optical element (lens) 2 provided at the front end portion on the substrate P side. These optical elements are supported by a lens barrel PK. In this embodiment, the projection optical system PL is a reduction system, in which the projection magnifications β is ¼ or ⁄1;5, for example. The projection optical system PL may be an equal magnification system or an enlargement system. An outer circumferential portion of the lens barrel PK is provided with a flange portion FLG. In addition, on the lower side step 3B of the main column 3, a lens barrel support plate 8 is supported via a vibration isolation unit 7. By engaging the flange portion FLG of the projection optical system PL with the lens barrel support plate, the projection optical system PL is supported to the lens barrel support plate 8.

The optical element 2 at the front end portion of the projection optical system PL of this embodiment is provided attachably and detachably (replaceably) to the lens barrel PK. The fluid 1 in the immersion region AR2 contacts the optical element 2. The optical element 2 is formed by fluorite. Because the fluorite has high attractiveness with water, the fluid 1 can be adhered substantially to the entire surface of the fluid contact surface 2a of the optical element 2. In other words, because the fluid (water) 1 having high adherence with the fluid contact surface 2a of the optical element 2 is supplied in this embodiment, the adherence between the fluid contact surface 2a of the optical element 2 and the fluid 1 is high. Therefore, an optical path between the optical element 2 and the substrate P can be accurately filled with the fluid 1. In addition, the optical element 2 may be quartz having high attractiveness with water. Moreover, by performing a hydrophilization (lyophilization) process to surface 2a, the attractiveness with the fluid 1 can be increased.

A plate member 2P is provided so as to surround the optical element 2. A surface (i.e., lower surface) that faces the substrate P of the plate member 2P is a flat surface. The lower surface (fluid contact surface) 2a of the optical element 2 also is a flat surface, and the lower surface of the plate member 2P and the lower surface of the optical element 2 are substantially flat. As a result, the immersion region AR2 can be well formed in a wide range. In addition, the lower surface of the plate member 2P can be processed with a surface treatment (hydrophilic treatment) similarly to the optical element 2.

Figure 7:
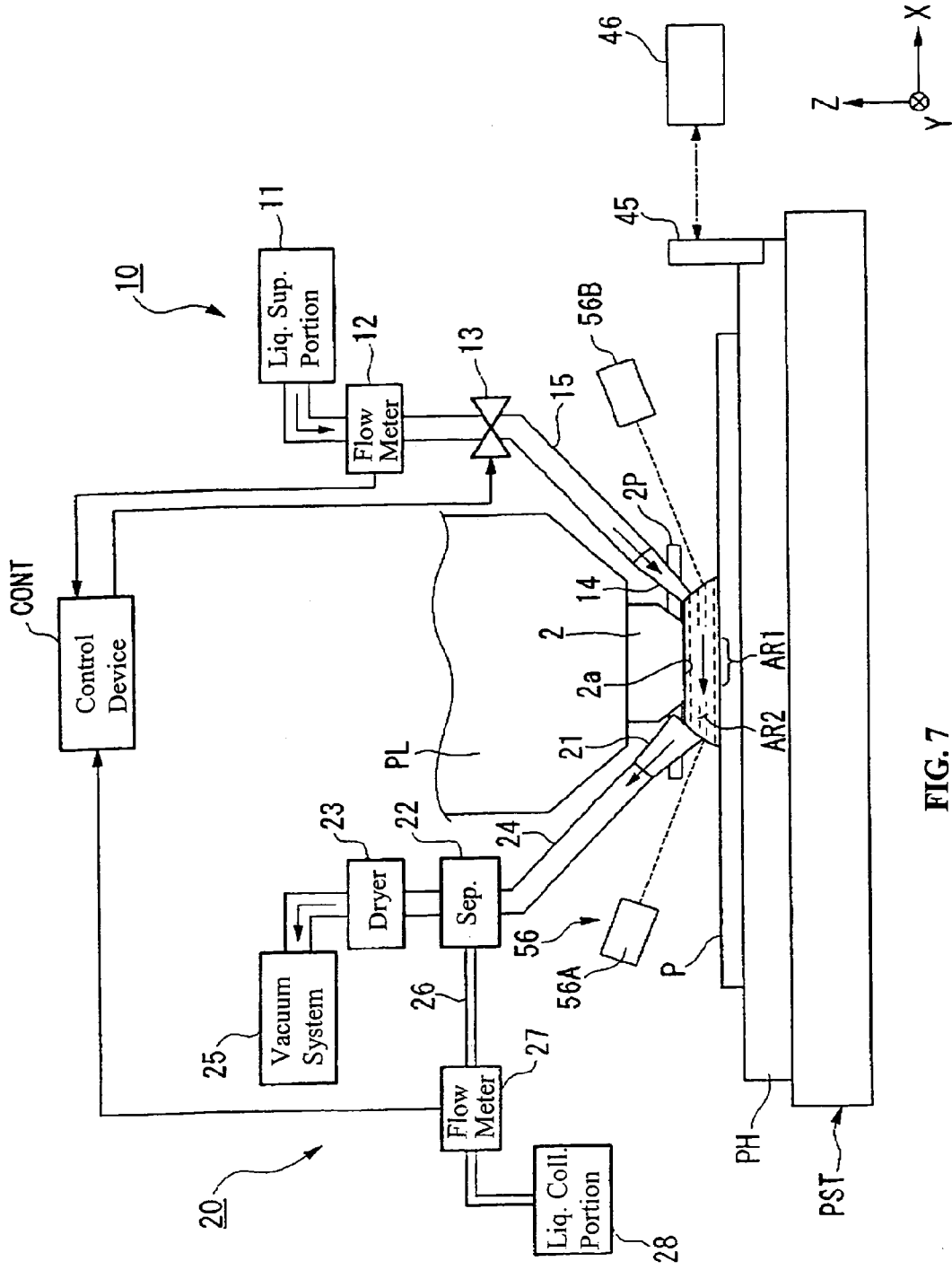
FIG. 7 is a schematic structural diagram showing the vicinity of an end portion of a projection optical system, a liquid supply mechanism, and a liquid collection mechanism.

FIG. 7 is an enlarged diagram showing the vicinity of the fluid supply mechanism 10, fluid collecting mechanism 20, and the front portion of the projection optical system PL. The fluid supply mechanism 10 supplies the fluid 1 between the projection optical system PL and the substrate P, and is equipped with a fluid supply portion 11 that can eject the fluid 1, and a supply nozzle 14 that is connected to the fluid supply portion 11 via a supply tube 15 and supplies the fluid ejected from the fluid supply portion 11 onto the substrate P. The supply nozzle 14 is positioned near the surface of the substrate P. The fluid supply portion 11 is equipped with a tank for accommodating the fluid 1, a pressure pump, and the like. The fluid 1 is supplied onto the substrate P through the supply tube 15 and the supply nozzle 14. The fluid supply operation of the fluid supply portion 11 is controlled by the control device CONT, and the control device CONT can control the amount of fluid supplied per unit time to the substrate P by the fluid supply portion 11.

In the middle of the supply tube 15, a flow meter 12 for measuring the amount of the fluid 1 supplied to the substrate P by the fluid supply portion 11 (amount of fluid supplied per unit time) is provided. The flow meter 12 constantly monitors the amount of fluid 1 to be supplied on the substrate P and outputs the result of the measurement to the control device CONT. In addition, a valve 13 for opening and closing a flow path of the supply tube 15 is provided in the supply tube 15 between the flow meter 12 and the supply nozzle 14. The open/close operation of the valve 13 is controlled by the control device CONT. In addition, the valve 13 according to this embodiment is of a so-called normal-off type that mechanically closes the flow path of the supply tube 15 when a drive source (power source) of the exposure apparatus EX (control device CONT) is stopped due to, for example, power outage or the like.

The fluid collecting mechanism 20 collects the fluid on the substrate P supplied by the fluid supply mechanism 10 and includes a collecting nozzle (absorption opening) 21 positioned near the surface of the substrate P, and a vacuum system 25 connected to the collecting nozzle 21 via a collecting tube 24. The vacuum system 25 is structured by including a vacuum source, and its operation is controlled by the control device CONT. By driving the vacuum system 25, the fluid 1 on the substrate P is collected through the collecting nozzle 21 along with the ambient gas (air). In addition, as the vacuum system 25, a vacuum system for a factory, in which the exposure apparatus EX is located, may be used without providing a separate vacuum pump on the exposure apparatus.

A gas/fluid separator 22 that separates the fluid 1 and the gas absorbed by the collecting nozzle 21 is provided in the middle of the collecting tube 24. As described above, the fluid 1 on the substrate P and the ambient gas are collected by the collecting nozzle 21. The gas/fluid separator 22 separates the fluid 1 and the gas collected by the collecting nozzle 21. For the gas/fluid separator 22, a gravity separation method that separates the fluid and the gas by dropping the fluid using gravity through a hole portion, or a centrifugal separation method that separates the collected fluid and gas using centrifugal force, may be used. The vacuum system 25 absorbs the gas separated by the gas/fluid separator 22.

A dryer 23 that dries the gas separated by the gas/fluid separator 22 is provided in the collecting tube 24 between the vacuum system 25 and the gas/fluid separator 22. If a fluid composition is mixed in the gas separated by the gas/fluid separator 22, by drying the gas using the dryer 23 and by flowing the dried gas into the vacuum system 25, occurrence of troubles, such as malfunction of the vacuum system 25, originated from the fluid composition that is flowed thereinto, can be prevented. For the dryer 23, a method for removing the fluid composition by cooling the gas supplied by the gas/fluid separator 22 (gas in which the fluid composition is mixed) below the dew point of the fluid or a method for removing the fluid composition by heating the gas above the boiling point of the fluid, may be used.

On the other hand, the fluid 1 that has been separated by the gas/fluid separator 22 is collected in a fluid collecting portion 28 through a second collecting tube 26. The liquid collecting portion 28 is equipped with a tank that accommodates the collected fluid 1 and the like. The fluid 1 collected by the fluid collecting portion 28 may be, for example, disposed or recycled by returning it to the fluid supply portion 11 or the like after cleaning. In addition, a flow meter 27 that measures the amount of collected fluid 1 (the amount of fluid collected per a unit time) is provided in the middle of the second collecting tube between the gas/liquid separator 22 and the fluid collecting portion 28. The flow meter 27 constantly monitors the amount of the fluid collected from the substrate P and outputs the result of the measurement to the control device CONT. As described above, the liquid 1 on the substrate P and the ambient gas are collected from the collecting nozzle 21. By separating the fluid 1 and ambient gas by the gas/fluid separator 22 and sending only the fluid composition to the flow meter 27, the flow meter 27 can accurately measure the amount of fluid uncollected from the substrate P.

In addition, the exposure apparatus EX is equipped with a focus detection system 56 that detects a position of a surface of the substrate P supported by the substrate stage PST. The focus detection system 56 is equipped with a light projection portion 56A that projects a detection luminous flux onto the substrate P from a diagonal direction through the fluid 1, and a light receiving portion 56B that receives reflection light of the detection luminous flux reflected on the substrate P. The result of receiving light by the focus detection system 56 (light receiving portion 56B) is output to the control device CONT. Based on the result of detection by the focus detection system 56, the control device CONT can detect the positional information of the surface of the substrate P in the Z-axis direction. In addition, by projecting a plurality of luminous fluxes by the light projection portion 56A, the inclination information of the substrate P in the θX and θY directions also can be obtained.

In addition, as shown in a partial cross-sectional diagram in FIG. 6, the fluid supply mechanism 10 and the fluid collecting mechanism 20 are separately supported with respect to the lens barrel support plate 8. As a result, vibration generated at the fluid supply mechanism 10 and the fluid collecting mechanism 20 is hardly transferred to the projection optical system PL through the lens barrel support plate 8.

Figure 8:
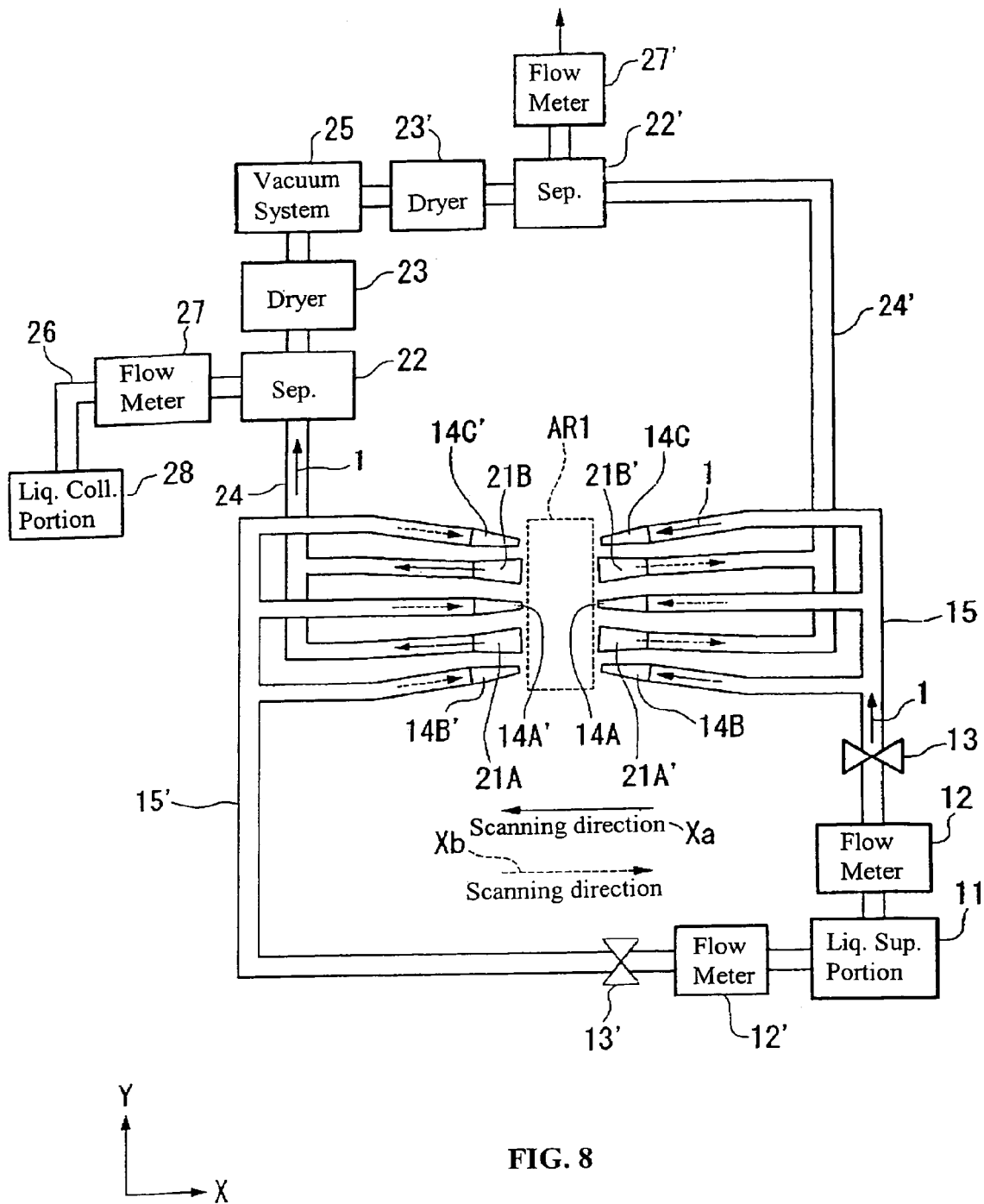
FIG. 8 is a plan view showing a positional relationship among a projection area of the projection optical system, the liquid supply mechanism, and the liquid collection mechanism.

FIG. 8 is a plane diagram showing the positional relationship of the fluid supply mechanism 10, the fluid collecting mechanism 20, and the projection region AR1 of the projection optical system PL. The projection region AR1 of the projection optical system PL is in a rectangular shape (slit shape) that is long and thin and extends in the Y-axis direction. Three supply nozzles 14A-14C are positioned on the +X side, and two collecting nozzles 21A and 21B are positioned on the −X side, so as to sandwich the projection region AR1 in the X-axis direction, and the collecting nozzles 21A and 21B are connected to the vacuum system 25 via the collecting tube 24. Furthermore, at the position at which the supply nozzles 14A-14C and the collecting nozzles 21A and 21B are rotated substantially by 180°, the supply nozzles 14A'-14C' and collecting nozzles 21A'0 and 21B' are positioned. The supply nozzles 14A-14C and the collecting nozzles 21A' and 21B' are arranged alternately in the Y-axis direction, and the supply nozzles 14A'-14C' and the collecting nozzles 21A and 21B are alternately arranged in the Y-axis direction. The supply nozzles 14A'-14C' are connected to the fluid supply portion 11 via the supply tube 15', and the collecting nozzles 21A' and 21B' are connected to the vacuum system 25 via a collecting tube 24'. Similar to the supply tube 15, a flow meter 12' and a valve 13' are provided in the middle of the supply tube 15'. In addition, similar to the collecting tube 24, a gas/fluid separator 22' and a dryer 23' are provided in the middle of the collecting tube 24'.

Next, steps for exposing the pattern of the mask M onto the substrate P using the above-described exposure apparatus EX are described.

After loading the mask M on the mask stage MST and loading the substrate P onto the substrate stage PST, the control device CONT drives the fluid supply portion 11 of the fluid supply mechanism 10 and supplies the predetermined amount of the fluid 1 per unit time onto the substrate P through the supply tube 15 and the supply nozzle 14. In addition, the control device CONT drives the vacuum system 25 of the fluid collecting mechanism 20 in accordance with the supply of the fluid 1 by the fluid supply mechanism 10, and collects the predetermined amount of the fluid 1 per unit time through the collecting nozzle 21 and the collecting tube 24. As a result, an immersion region AR2 for the fluid 1 is formed between the optical element 2 at the front end portion of the projection optical system PL and the substrate P (step of filling fluid). To form the immersion region AR2, the control device CONT controls each of the fluid supply mechanism 10 and the fluid collecting mechanism 20 so as to make the amount of the fluid supplied to the substrate P and the amount of fluid collected from the substrate P become substantially the same amount. In addition, the control device CONT illuminates the mask M by the exposure light EL using the illumination optical system IL, and projects the image of the pattern on the mask M onto the substrate P through the projection optical system PL and the fluid 1.

At a time of scan exposure, a portion of a pattern image on the mask M is projected onto the projection region AR1. Synchronous to the mask M moving in the −X direction (or +X direction) at speed V with respect to the projection optical system PL, the substrate P moves in the +X direction (or −X direction) at speed β·V (where β is a projection magnification) via the substrate stage PST. Then, after the completion of the exposure in one shot region, the next shot region is moved to a scan start position by the stepping of the substrate P, and the exposure process for each shot region is sequentially performed using a step-and-scan method. In this embodiment, the fluid 1 is set to flow in the direction parallel to the direction of movement of the substrate P, that is, in the same direction as the direction of the movement of the substrate P.

In other words, when performing the scan exposure by moving the substrate P in the scan direction (−X direction) shown by an arrow Xa (see FIG. 8), supply and collection of the fluid 1 by the fluid supply mechanism 10 and the fluid collecting mechanism 20 are performed using the supply tube 15, the supply nozzle 14A-14C, the collecting tube 24, and the collecting nozzles 21A and 21B. That is, when the substrate P moves in the −X direction, the fluid 1 is supplied between the projection optical system PL and substrate P using the supply nozzle 14 (14A-14C), and the fluid 1 on the substrate P is collected by the collecting nozzle 21 (21A and 21B) along with the ambient gas. Therefore, the fluid 1 flows in the −X direction so as to fill between the optical element 2 at the front end portion of the projection optical system PL and the substrate P.

On the other hand, when performing the scan exposure by moving the substrate P in the scan direction (+X direction) shown with an arrow Xb (see FIG. 8), supply and collection of the fluid 1 by the fluid supply mechanism 10 and the fluid collecting mechanism 20 are performed using the supply tube 15', the supply nozzles 14A'-14C', the collecting tube 24', and the collecting nozzles 21A' and 21B'. That is, when the substrate P moves in the +X direction, the fluid 1 is supplied between the projection optical system PL and substrate P using the supply nozzle 14' (14A'-14C'), and the fluid 1 on the substrate P is collected by the collecting nozzle 21' (21A' and 21B') along with the ambient gas. Therefore, the fluid 1 flows in the +X direction so as to fill between the optical element 2 at the front end portion of the projection optical system PL and the substrate P. In this case, the fluid 1 supplied via the supply nozzle 14 flows as if it is pulled between the optical element 2 and the substrate P in accordance with the movement of the substrate P in the −X direction or +X direction. Therefore, the fluid 1 can be supplied easily between the optical element 2 and the substrate P even if the supply energy of the fluid supply mechanism 10 (fluid supply portion 11) is small. Therefore, by switching the direction of the flow of the fluid 1 depending on the scan direction, the space between the optical element 2 and the substrate P can be filled with the fluid 1 even when the substrate P is scanned in either direction of the +X direction and the −X direction. Therefore, high resolution and wide depth of focus can be obtained.

During the exposure process, the result of measurement by the flow meter 12 provided in the fluid supply mechanism 10 and the result of the measurement by the flow meter 27 provided in the fluid collecting mechanism 20 are constantly output to the control device CONT. The control device CONT compares the result of measurement by the flow meter 12, that is, the amount of fluid supplied on the substrate P by the liquid supply mechanism 10, and the result of measurement by the flow meter 27, that is, the amount of fluid collected from the substrate P by the liquid collecting mechanism 20, and controls the valve 13 of the fluid supply mechanism 10 based on the result of the comparison. In detail, the control device CONT determines a difference between the amount of fluid supplied on the substrate P (the result of measurement by the flow meter 12) and the amount of fluid collected from the substrate P (the result of measurement by the flow meter 27), and controls the valve 13 based on whether the determined difference exceeds a predetermined tolerance (threshold value). As described above, since the control device CONT controls each of the fluid supply mechanism 10 and the fluid collecting mechanism 20 so as to make the amount of the fluid supplied to the substrate P and the amount of fluid collected from the substrate P substantially the same, the above-described determined difference becomes substantially zero under a condition in which the fluid supply operation by the fluid supply mechanism 10 and the fluid collection operation by the fluid collecting mechanism 20 are normally performed.

If the determined difference is more than the tolerance, that is, if the amount of the fluid collected is extremely small compared to the amount of fluid supplied, the control device CONT determines, as a result of the malfunction of the collecting operation by the fluid collecting mechanism 20, that a sufficient amount of the fluid is not collected. At this time, the control device CONT determines that abnormalities, such as malfunctions, occurred at the vacuum system 25 of the fluid collecting mechanism 20, for example. In addition, to prevent a leaking of the fluid 1 due to the fact that the fluid 1 cannot be normally collected by the fluid collecting mechanism 20, the control device CONT closes the flow path of the supply tube 15 by operating the valve 13 of the fluid supply mechanism 10, and stops the supply of the fluid 1 to the substrate P by the fluid supply mechanism 10. Accordingly, the control device CONT compares the amount of fluid supplied to the substrate P from the fluid supply mechanism 10 and the amount of the fluid collected by the fluid collecting mechanism 20, detects the abnormality of the collecting operation of the fluid collecting mechanism 20 based on the result of the comparison, and stops the supply of the fluid 1 to the substrate P when the fluid 1 is oversupplied or abnormalities are detected. In addition, the control device CONT may generate a warning via the above-described warning device K when the abnormality is detected. In addition, the control device CONT may display the abnormality to a display device by providing the display device to the above-described warning device K. Furthermore, by providing a water leakage sensor at at least a part (e.g., gutter member 72 or groove portion) of the collecting device 71, the abnormality can be detected based on the result of the detection by the water leakage sensor.

At this time, the fluid 1 that has been supplied onto the substrate P is not collected by the fluid collecting mechanism 20, as described in the above first embodiment, but instead outflows directly from the substrate stage PST or indirectly onto the upper surface 41A of the substrate support plate 41 via the X guide stage 44. A part of the outflown fluid is collected by flowing into the gutter member 72. In addition, the fluid remaining on the support plate upper surface 41A can be collected by flowing the fluid into the gutter member 72 by the control device CONT driving (an actuator of) the vibration actuation unit 9 to tilt the substrate support plate 41.

As described above, in this embodiment, by filling the optical path between the optical element 2 and the substrate P with fluid 1, high resolution and large depth of focus can be obtained, and even when the fluid scatters or outflows from the substrate P for any reason, troubles, such as malfunction of the device and/or members, electric leakage, and/or rust/oxidation, are prevented beforehand by collecting the fluid, allowing smooth execution of the exposure processes.

Some preferred embodiments according to this invention are described above with reference to the attached drawings.

However, this invention is not limited to these embodiments. One of ordinary skill in the art would be able to achieve various modifications and corrections.

Figure 9:
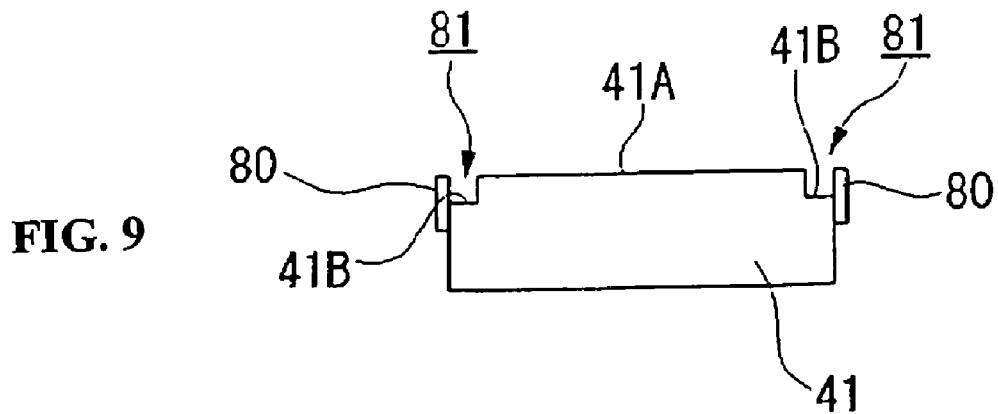
FIG. 9 is a diagram showing another embodiment of a collection portion arranged on the substrate supporting plate.

For example, in the above embodiments, a gutter member 72 is provided in the vicinity of the substrate support plate 41 as a collecting portion of the collecting device 71. However, the invention is not limited to this. As shown in FIG. 9, for example, by forming a groove portion 81 by a step portion 41B, which is formed lower than the substrate top surface 41A, along the entire circumference of the edge of the substrate support plate 41, and a wall member 80 provided on the side surface of the substrate support plate 41, the fluid scattered and outflown to the substrate support plate 41 is collected by the groove portion 81. In this case, it also is preferred that the fluid repellent treatment is performed in the groove portion 81 to smoothly collect the fluid, and that the step portion 41B is inclined.

Figure 10:
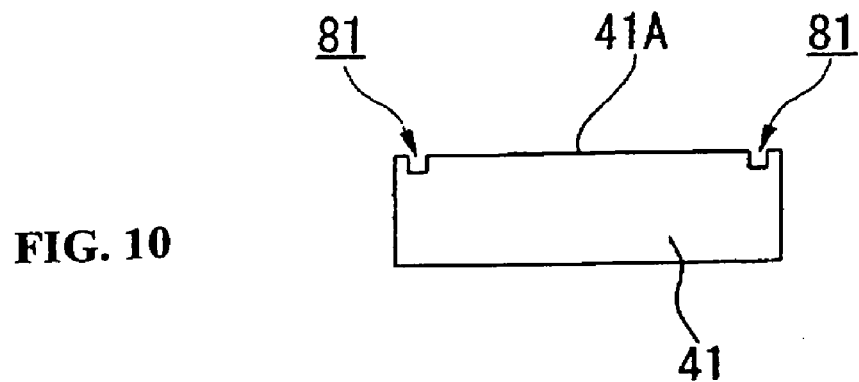
FIG. 10 is a diagram showing another embodiment of the collection portion arranged on the substrate supporting plate.

Furthermore, as shown in FIG. 10, without using the wall member, the groove portion 81 may be provided on the entire circumference of the outer circumference of the substrate support plate 41, and this groove portion 81 may function as a collecting portion.

The groove portion 81 need not necessarily be provided on the entire circumference of the substrate support plate 41. For example, two groove portions 81 may be provided on the outer circumference of the substrate support plate 41 in the X direction (scan direction), and two gutter members 72 may be provided along the outer circumference of the substrate support plate 41 in the Y direction (non-scan direction). Accordingly, portions of the collecting devices 71 disclosed in the embodiment may be combined.

Figure 11:
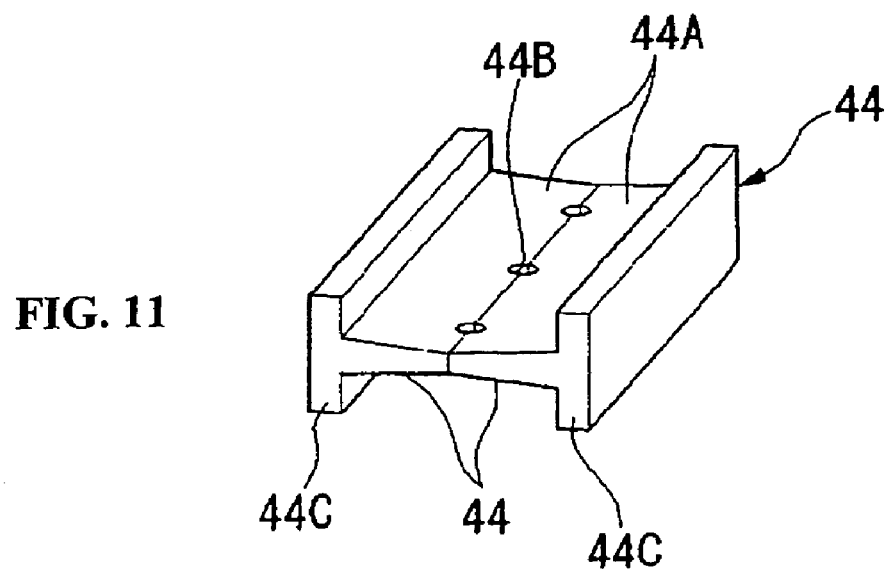
FIG. 11 is a perspective view showing another embodiment of the X guide stage.

In addition, in the above embodiments, the description was made with the X guide stage 44 having a cross-section schematically in a U-shape. However, as shown in FIG. 11, it may be schematically in an H shape in a cross-sectional view. Because a large load is applied in the width direction (left-right direction in FIG. 11) by the air from the air bearing provided on the substrate stage PST, the sidewall 44C of the X guide stage 44 is made in a shape symmetrical in the up-down direction by forming in the H shape, to prevent unbalanced load from being applied to the X guide stage 44. In addition, the inclined surface 44A may be provided only on the upper portion side. However, to prevent the unbalanced load, it is preferred that it be provided symmetrically on the lower surface side as well.

Furthermore, in the above embodiments, the fluid remaining on the substrate upper surface 41A is removed by tilting the stage support plate 41 using the vibration isolation unit 9. However, a structure in which the substrate upper surface 41A is made an inclined surface that inclines with respect to the horizontal plane may also be used. In this case, since the position of the substrate surface in the Z-axis direction changes due to the movement of the substrate stage PST, the position of the surface of the substrate P should be corrected by driving the position of the table portion PH in the Z-axis direction depending on the position of the substrate stage PST.

Similarly, to make the removal of the fluid remaining on the table portion PH smooth, the surface of the table portion PH may be made an inclined surface or processed with the fluid repellent treatment.

Moreover, when tilting the substrate support plate 41, and when the surface of the table portion PH is made an inclined surface, it is preferred to incline the substrate support plate 41 such that the side on which members that are not supposed to contact the fluid, such as movable mirrors and fiducial marks, are not provided on the lower side.

As described above, the fluid 1 according to the embodiments is composed of pure water. Advantages of using such a fluid are that it can be obtained in large amounts at semiconductor manufacturing facilities and that there are no negative effects to the photoresist or the optical elements (lens) on the substrate P. In addition, because pure water has no negative effects to the environment, and because the amount of impurities is extremely low, it is expected to clean the surface of the substrate P and the surface of the optical elements provided on the front end surface of the projection optical system PL.

The refractive index of pure water (water) with respect to the exposure light EL having the wavelength of approximately 193 nm is about 1.44, when the ArF excimer laser light (wavelength: 193 nm) is used as the light source for the exposure light EL. Therefore, high resolution is obtained by shortening the wavelength by 1/n, that is, approximately 139 nm on the substrate P. In addition, since the depth of focus is increased by approximately n times compared to that in the air, that is, approximate 1.44 times, when it is only sufficient to secure the depth of focus that is approximately the same as when using in the air, the numeral aperture for the projection optical system PL can be increased, and thereby the resolution increases as well.

However, fluids other than water may be used. For example, if the light source for the exposure light EL is a $F_2$ laser, the $F_2$ laser light is not transmitted in water. Thus, a fluid of a fluorine system, such as fluorine oil and perfluorinated polyether (PFPE), that can transmit the $F_2$ laser light may be used as the fluid 1. In addition, it is also possible to use, as the fluid 1, a material that has transmissivity with respect to the exposure light EL, has high refractivity, and is stable with respect to photoresist applied on the projection optical system PL and the surface of the substrate P (e.g., cedar oil).

In addition, in these embodiments, the optical element 2 is mounted on the front end of the projection optical system PL. The optical element mounted on the front end of the projection optical system PL can be an optical plate used for adjusting the optical characteristics of the projection optical system PL, such as aberrations (spherical aberration, coma etc.). Instead, it may be a parallel plate that can transmit the exposure light EL.

In each of the above-described embodiments, the shape of the above-described nozzles is not particularly limited. For example, the supply and collection of the fluid 1 may be performed by two pairs of nozzles provided at the long sides of the projection region AR1. In this case, to allow the supply and collection of the fluid 1 to be performed in any one of the +X direction and the −X direction, arrangements may be made by positioning the supply nozzles and the collection nozzles above and below.

For the substrate P in each of the above-described embodiments, not only a semiconductor wafer for manufacturing semiconductor devices, but also glass substrates for manufacturing display devices, ceramic wafer for manufacturing thin-film magnetic heads, original plates for manufacturing masks and reticles (synthetic quartz and silicon wafer) used in an exposure device, may be used.

In the above-described embodiments, an exposure apparatus is provided in which the optical path between the projection optical system PL and the substrate P is locally filled with a fluid. However, this invention can be used in an immersion exposure apparatus in which a stage that holds a substrate to be exposed is moved in a fluid tank, as disclosed in Japanese Laid-Open Patent Application No. H06-124873, or an immersion exposure apparatus in which a fluid tank having a predetermined depth is formed on a stage and the substrate is held therein, as disclosed in Japanese Laid-Open Patent Application No. H10-303114.

As the exposure apparatus EX, in addition to the scan-type exposure apparatus (scanning stepper) using a step-and-scan method that scan-exposes the pattern on the mask M by synchronously moving the mask M and the substrate P, a projection exposure apparatus (stepper) using a step-and-repeat method in which the pattern on the mask M is entirely exposed in a state where the mask M and the substrate P are stationary, and the substrate P is sequentially stepped, may be used. In addition, this invention may be used in an exposure apparatus using a step-and-stitch method in which at least two patterns are partially superimposingly transferred onto the substrate P.

In addition, this invention may be used in a twin-stage type exposure apparatus, which is equipped two wafer stages (substrate stages) and in which the two wafer stages are switched between an alignment position and an exposure position, as disclosed in Japanese Laid-Open Patent Application No. 2001-160530. In this case, the fluid supply portion 11 and the fluid collecting portion 28 may be maintained driven when the two wafer stages are switched. This is because, as described above, the fluid 1 from the fluid supply portion 11 can be collected via the substrate support plate 41. As a result, the throughput for the twin stage type exposure device can be further increased.

As for the type of the exposure apparatus EX, the invention is not limited to the exposure apparatus for manufacturing semiconductor elements that exposes semiconductor element patterns on the substrate P. It may be used for an exposure apparatus for manufacturing liquid crystal display elements or for manufacturing displays, as well as an exposure apparatus for manufacturing thin-film magnetic heads, image shooting elements (CCD), reticles or masks.

When using a linear motor for the substrate stage PST or the mask stage MST (see, e.g., U.S. Pat. No. 5,623,853 or U.S. Pat. No. 5,528,118), it is preferred to use either an air flow type that uses an air bearing as a type of flowing the stages with respect to the support plate, or a magnetic flow type that uses Lorentz force. In addition, each of the stages PST and MST may be of a type that moves along a guide, or each may be of a guideless type that provides no guides.

For the drive mechanism for each of the stages PST and MST, a flat motor may be used that drives each of the stages PST and MST using magnetic force by facing a magnetic unit in which magnets are two-dimensionally positioned, and an armature unit in which coils are two-dimensionally positioned. In this case, either one of the magnetic unit and the armature unit should be connected to the stages PST and MST, and the other one of the magnetic unit and the armature unit should be provided on the moving surface side of the stages PST and MST.

The reaction force generated by the movement of the substrate stage PST may be transmitted mechanically to the floor (ground) using a frame member, as described in Japanese Laid-Open Patent Application No. H08-166475 (U.S. Pat. No. 5,528,118), so as not to transfer it to the projection optical system PL. The reaction force generated by the movement of the mask stage MST may be transmitted mechanically to the floor (ground) using a frame member, as described in Japanese Laid-Open Application No. H8-330224 (U.S. Ser. No. 08/416,558), so as not to transfer it to the projection optical system PL.

The exposure apparatus EX of this embodiment is manufactured by assembling various subsystems, including each structural element described in this application, so as to maintain predetermined mechanical accuracy, electrical accuracy, and optical accuracy. To assure these various accuracies, adjustments are performed before and after the assembly by adjusting the various optical systems to achieve the optical accuracy, by adjusting the various mechanical systems to achieve the mechanical accuracy, and by adjusting the various electrical systems to achieve the electrical accuracy. The process for assembling, from various subsystems, the exposure apparatus includes mechanical connections, wiring connections for electric circuits, ducting connections for air pressure circuits, and the like, that are performed for the various subsystems. Before the assembly process of these various subsystems to form the exposure device, individual assembly processes for each subsystem are performed. After completing the assembly processes of the various subsystems to form the exposure device, the entire adjustments are conducted to assure various accuracies as the exposure apparatus as a whole. In addition, it is preferred that the manufacturing of the exposure apparatus be performed in a clean room in which the temperature and cleanliness are controlled.

Figure 12:
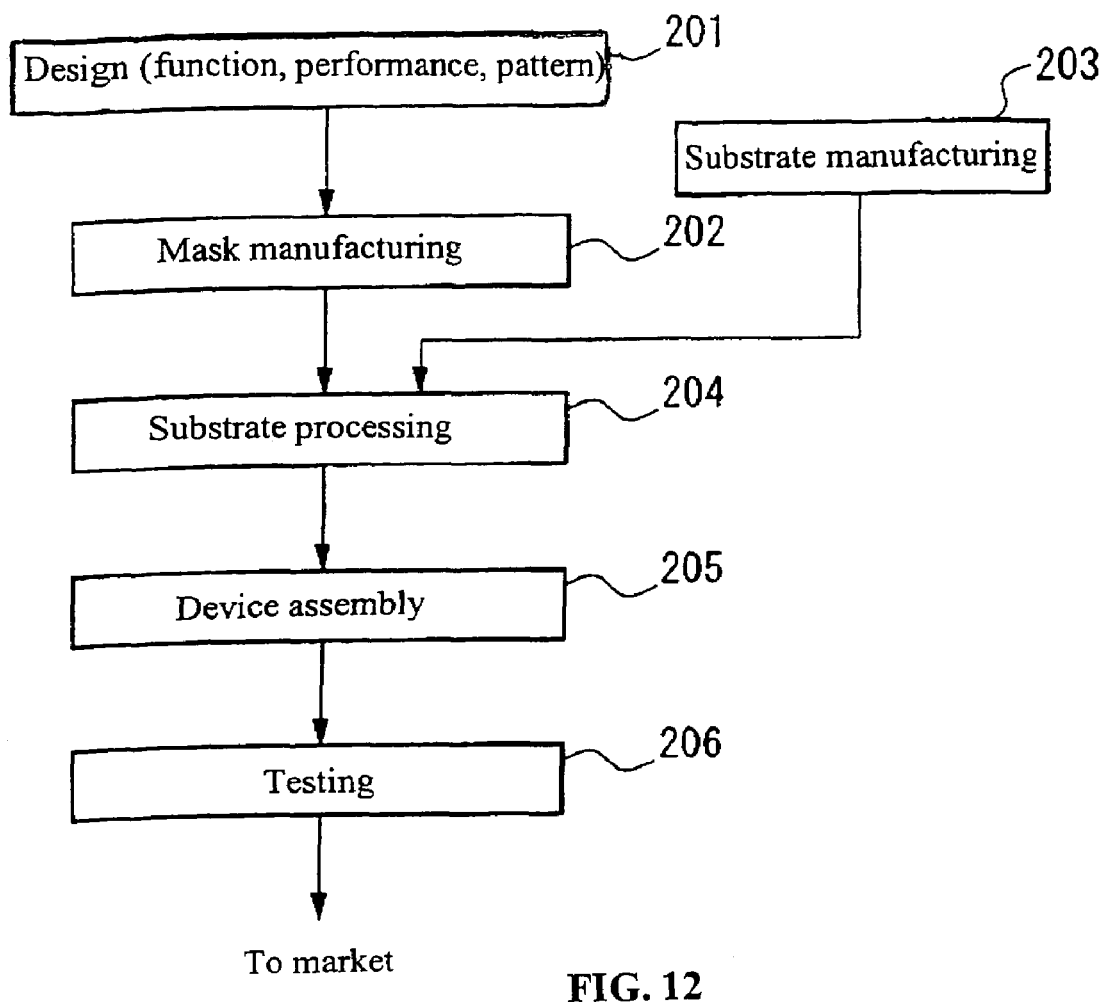
FIG. 12 is a flowchart showing an example of a manufacturing process of a semiconductor device.

As shown in FIG. 12, a micro device, such as a semiconductor device, is manufactured through a step 201 of designing functions and performance of the micro device, a step 202 of manufacturing a reticle (s) based on the design step, a step 203 of manufacturing a substrate that is a base material for the device, a step 204 of processing the substrate where a pattern of the reticle is exposed on the substrate by the exposure apparatus EX of the above-described embodiments, a step 205 of assembling the device (including dicing process, bonding process, and packaging process), and an inspection step 206.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, that are exemplary, other combinations and configurations, including more, less or only a single element, are also within the spirit and scope of the invention.

What is claimed is:

1. A stage device comprising:
    a movable body that holds an object to which liquid is supplied;
    a supporting plate which movably supports the movable body, the movable body being movable linearly relative to the supporting plate; and
    a collection device arranged to collect liquid that has been discharged to the supporting plate, the collection device including a collection portion arranged along an outer circumference of the supporting plate.

2. The stage device of claim 1, wherein the collection portion surrounds a guide surface of the supporting plate by being arranged adjacent the outer circumference of the supporting plate.

3. The stage device of claim 1, wherein the collection portion includes an inclined portion which conveys the liquid in a downward direction from a surface of the supporting plate.

4. The stage device of claim 1, wherein the collection portion is liquid repellant.

5. The stage device of claim 1, wherein the supporting plate is liquid repellant.

6. The stage device of claim 1, further comprising a stage structural body arranged above the supporting plate, the stage structural body is provided with an inclined portion which conveys the liquid in a downward direction from the object.

7. The stage device of claim 6, wherein the stage structural body is liquid repellant.

8. The stage device of claim 1, further comprising a spraying device which sprays fluid on a surface of the supporting plate to facilitate removal of the liquid remaining on the surface of the supporting plate.

9. An exposure apparatus which exposes, by a projection optical system, a pattern of a mask onto a photosensitive substrate which is held by a substrate stage, the exposure apparatus comprising:
the stage device of claim 1, which is used as the substrate stage, such that the photosensitive substrate is the object; and
wherein an image of the pattern is projected onto the photosensitive substrate through the liquid which is located between an end portion of the projection optical system and the photosensitive substrate.

10. The stage device of claim 1, wherein the collection portion includes a groove portion formed in the supporting plate.

11. A stage device comprising:
a movable body that holds an object to which liquid is supplied;
a supporting plate which movably supports the movable body;
a collection device arranged to collect liquid that has been discharged to the supporting plate; and
a stage structural body arranged above the supporting plate, the stage structural body is provided with an inclined portion which conveys the liquid in a downward direction from the object, wherein a through hole which passes through the stage structural body is formed in a low end portion of the inclined portion.

12. An exposure apparatus which exposes, by a projection optical system, a pattern of a mask onto a photosensitive substrate which is held by a substrate stage, the exposure apparatus comprising:
the stage device of claim 11, which is used as the substrate stage, such that the photosensitive substrate is the object; and
wherein an image of the pattern is projected onto the photosensitive substrate through the liquid which is located between an end portion of the projection optical system and the photosensitive substrate.

13. A stage device comprising:
a movable body that holds an object to which liquid is supplied;
a supporting plate which movably supports the movable body;
a collection device arranged to collect liquid that has been discharged to the supporting plate; and
an actuator which inclines the supporting plate to facilitate removal of the liquid remaining on a surface of the supporting plate.

14. An exposure apparatus which exposes, by a projection optical system, a pattern of a mask onto a photosensitive substrate which is held by a substrate stage, the exposure apparatus comprising:
the stage device of claim 13, which is used as the substrate stage, such that the photosensitive substrate is the object; and
wherein an image of the pattern is projected onto the photosensitive substrate through the liquid which is located between an end portion of the projection optical system and the photosensitive substrate.

15. A stage device comprising:
a movable body that holds an object to which liquid is supplied;
a supporting plate which movably supports the movable body;
a collection device arranged to collect liquid that has been discharged to the supporting plate; and
a stage structural body arranged above the supporting plate, the stage structural body is provided with an inclined portion which conveys the liquid in a downward direction from the object, the movable body being movable linearly over the stage structural body.

16. The stage device of claim 15, wherein the collection device includes a collection portion arranged along an outer circumference of the supporting plate.

17. The stage device of claim 16, wherein the collection portion includes an inclined portion which conveys the liquid in a downward direction from a surface of the supporting plate.

18. The stage device of claim 16, wherein the collection portion is liquid repellant.

19. The stage device of claim 15, wherein the supporting plate is liquid repellant.

20. The stage device of claim 15, wherein a through hole which passes through the stage structural body is formed in a low end portion of the inclined portion.

21. The stage device of claim 15, wherein the stage structural body is liquid repellant.

22. The stage device of claim 15, further comprising an actuator which inclines the supporting plate to facilitate removal of the liquid remaining on a surface of the supporting plate.

23. The stage device of claim 15, further comprising a spraying device which sprays fluid on a surface of the supporting plate to facilitate removal of the liquid remaining on the surface of the supporting plate.

24. An exposure apparatus which exposes, by a projection optical system, a pattern of a mask onto a photosensitive substrate which is held by a substrate stage, the exposure apparatus comprising:
the stage device of claim 15, which is used as the substrate stage, such that the photosensitive substrate is the object; and
wherein an image of the pattern is projected onto the photosensitive substrate through the liquid which is located between an end portion of the projection optical system and the photosensitive substrate.

25. The stage device of claim 15, wherein the collection device includes a groove portion formed in the supporting plate.

* * * * *